United States Patent
Kye et al.

(10) Patent No.: US 6,784,992 B1
(45) Date of Patent: Aug. 31, 2004

(54) POLARIZATION MEASUREMENT DEVICE AND METHOD

(75) Inventors: Jongwook Kye, Pleasanton, CA (US); Alden Acheta, Brentwood, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/383,119

(22) Filed: Mar. 5, 2003

(51) Int. Cl.$^7$ ................................................ G01J 4/00
(52) U.S. Cl. ...................................... 356/369; 356/364
(58) Field of Search ........................... 356/364, 365, 356/366, 367, 368, 369, 370; 438/16; 250/225; 355/53, 67, 71, 77

(56) References Cited

U.S. PATENT DOCUMENTS

| | | | |
|---|---|---|---|
| 4,937,459 A | 6/1990 | Ina ............................. 356/401 |
| 5,048,967 A | 9/1991 | Suzuki et al. ............. 356/237.5 |
| 5,751,538 A | 5/1998 | Nakasuji ..................... 361/234 |
| 6,027,843 A | 2/2000 | Kojima et al. ................. 430/30 |
| 6,352,800 B1 | 3/2002 | Suganaga ...................... 430/5 |
| 6,353,231 B1 | 3/2002 | Golladay et al. ........... 250/397 |
| 6,444,399 B1 | 9/2002 | Nakasuji ..................... 430/311 |
| 6,453,019 B1 | 9/2002 | Latter et al. ................ 379/67.1 |
| 6,501,534 B1 | 12/2002 | Singh et al. .................. 355/53 |
| 6,574,039 B1 | 6/2003 | Murata et al. ................ 355/71 |
| 6,597,435 B2 | 7/2003 | Poon et al. .................... 355/72 |
| 2004/0070744 A1 | 4/2004 | Ozawa ........................ 355/71 |

FOREIGN PATENT DOCUMENTS

EP       1152263 A1      11/2001     ............ G02B/1/10

Primary Examiner—Michael P. Stafira
Assistant Examiner—Juan D Valentin, II
(74) Attorney, Agent, or Firm—Farjami & Farjami LLP

(57) ABSTRACT

In one embodiment, a polarization measuring device comprises a light source, a reticle positioned below the light source, an opaque frame having a single aperture, the opaque frame positioned below the reticle, a lens positioned below the opaque frame, and a wafer having photoresist on its surface. The aperture of the frame allows no more than a first light ray to pass from the light source through the reticle and the lens onto a first surface point on the photoresist. The aperture of the frame also allows no more than a second light ray to pass from the light source through the reticle and the lens onto a second surface point on the photoresist. The degree of polarization of the light source can be determined from the first amount of light absorbed at the first surface point and the second amount of light absorbed at the second surface point.

13 Claims, 7 Drawing Sheets

POLARIZATION MEASUREMENT DEVICE AND METHOD

TECHNICAL FIELD

The present invention relates generally to the field of semiconductor manufacturing. More particularly, the present invention relates to photolithography testing devices.

BACKGROUND ART

During wafer fabrication, dies are formed on a semiconductor wafer. Dies may comprise, for example, a device or an integrated circuit as known in the art. Photolithography is a process which involves, among other things, passing light through a reticle and through a lens onto a layer of photoresist on a wafer to create patterns on the wafer. The dimensions of these patterns on the wafer correspond to the "feature size" of the device or circuit to be formed on the die. It is desirable to reduce the feature size of the individual components on the semiconductor wafer for various reasons as is known in the art.

One way to reduce the feature size is to use a larger diameter lens during photolithography. However, depending on the degree of polarization of light used during photolithography, a larger diameter lens may result in higher reflection of light by the photoresist on the wafer. Higher reflection corresponds to lower absorption of light by the photoresist. Presently, however, conventional photolithography devices are unable to measure the degree of polarization of light during photolithography. Moreover, conventional photolithography devices are unable to measure the polarization effect on a photoresist during photolithography. Accordingly there is a strong need in the art for a device and method for measuring the degree of polarization of light during photolithography. Furthermore, there is a need in the art for a device and method for measuring the polarization effect on a photoresist during photolithography.

SUMMARY

The present invention is directed to a device and method for measuring the degree of polarization of light during photolithography. The invention addresses and resolves the need in the art for a device and method for measuring the polarization effect on a photoresist during photolithography. According to an exemplary embodiment, the polarization measuring device comprises a light source, a reticle positioned below the light source, an opaque frame having a single aperture, the opaque frame positioned below the reticle, a lens positioned below the opaque frame, and a wafer having photoresist on its surface. The wafer is positioned below the lens. According to one particular embodiment, the opaque frame comprises a base, where the aperture is defined in the base. The opaque frame further comprises sidewalls extending from the base, where the sidewalls contact the bottom surface of the reticle. In one embodiment, the opaque frame comprises aluminum, although any opaque material may be used to form the base and sidewalls of the opaque frame.

In use, the aperture of the opaque frame allows no more than a first light ray to pass from the light source through the reticle and the lens onto a first surface point on the photoresist. Thus, the photoresist at the first point is exposed only to the first light ray. The first light ray further has a single angle of incidence. Therefore, the polarization effect at the first point on the photoresist is limited to the polarization effect of the first light ray.

The aperture of the opaque frame further allows no more than a second light ray to pass from the light source through the reticle and the lens onto a second surface point on the photoresist, wherein the photoresist at the second point is exposed only to the second light ray. The second surface point is different from the first surface point. Thus, the polarization effect at the second point on the photoresist is limited to the polarization effect of the second light ray.

The photoresist at the first point absorbs a first amount of light, and the photoresist at the second point absorbs a second amount of light. The amount of light absorbed at the first point and at the second point is dependent upon, among other things, the polarization of said first ray and said second ray, respectively, as well as the angle of incidence of the first ray and the second ray, respectively.

The degree of polarization of the light source can be determined from the first amount of light absorbed and the second amount of light absorbed, wherein the light source is determined to be randomly polarized if the first amount of light absorbed is the same as the second amount of light absorbed, and wherein the light source is determined to be polarized if the first amount of light absorbed is different from the second amount of light absorbed.

Other features and advantages of the present invention will become more readily apparent to those of ordinary skill in the art after reviewing the following detailed description and accompanying drawings.

DETAILED DESCRIPTION OF THE INVENTION

The present invention is directed to a device and method for measuring the degree of polarization of light during photolithography. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It is noted that, for the purpose of ease of illustration, the various elements and dimensions shown in the following figures are not drawn to scale.

Figure 1:
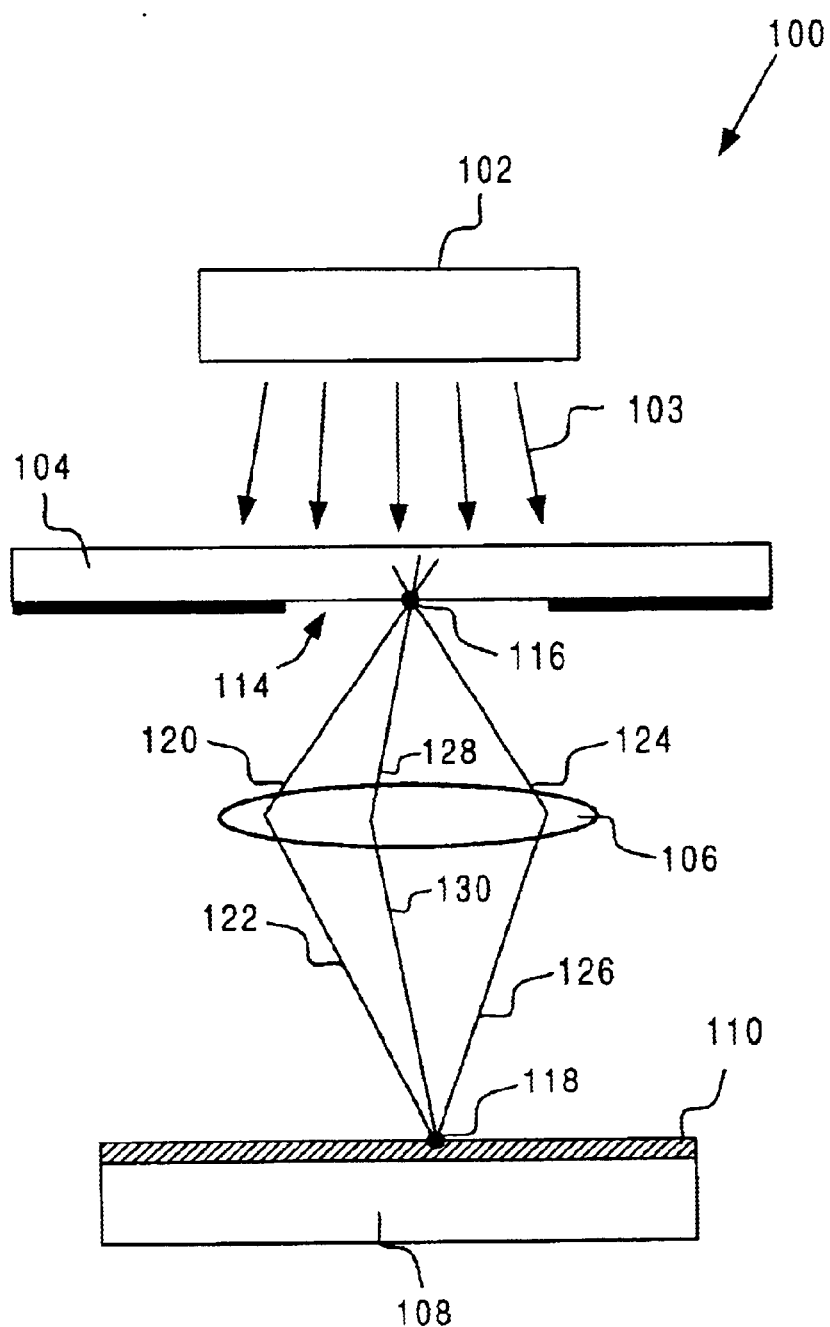
FIG. 1 depicts a block diagram of a known photolithography device.

To illustrate the features and advantages of the present invention by way of contrast, a brief description of a known photolithography device is provided with reference to FIG. 1. In FIG. 1, known photolithography device 100 is generally shown and comprises light source 102, reticle 104 situated below light source 102, and lens 106 situated below reticle 104. Wafer 108, having photoresist 110 on its surface, is placed below lens 106. Photoresist 110 is sensitive to light produced by light source 102 and exhibits characteristic changes upon exposure to light source 102. Reticle 104 has one or more openings, e.g., opening 114, corresponding to a pattern which is to be transferred onto photoresist 110.

Light source 102 generates light rays 103, some of which pass through opening 114 of reticle 104. For example, incident rays 120, 124 and 128 are shown passing through opening 114 at point 116. Incident rays 120, 124 and 128 are refracted by lens 106 onto photoresist 110. As shown in FIG. 1, refracted ray 122 is the refracted component of incident ray 120. Likewise, each of refracted rays 126 and 130 is the refracted component of incident rays 124 and 128, respectively. To preserve simplicity, each refracted ray 122, 126 and 130 will also be referred to as ray 122, 126 and 130, respectively.

Photoresist 110 is exposed to rays 122, 126 and 130. More particularly, rays 122, 126 and 130 converge at point 118 on photoresist 110. Additionally, rays 122, 126 and 130 arrive at various incident angles to the surface of photoresist 110 at point 118. As shown and described above, a number of light rays, e.g., rays 122, 126 and 130, converge and affect the level of absorption of light by photoresist 110 at any given point, e.g., point 118. More particularly, the extent to which photoresist 110 will either absorb or reflect each ray 122, 126 and 130 at point 118 corresponds to the degree of polarization of each ray 122, 126 and 130, respectively, as well as the angle of incidence of each ray 122, 126 and 130, respectively. However, since a number of light rays, each having a different angle of incidence, converge at any given point on photoresist 110, the effect of polarization at that point, e.g., point 118, is a combination of the polarization effect of each light ray, e.g., rays 122, 126 and 130, that converges at that point. This phenomenon applies to each point on photoresist 110 which is exposed to light rays 103 from light source 102, as shown more clearly in FIG. 2.

Figure 2:
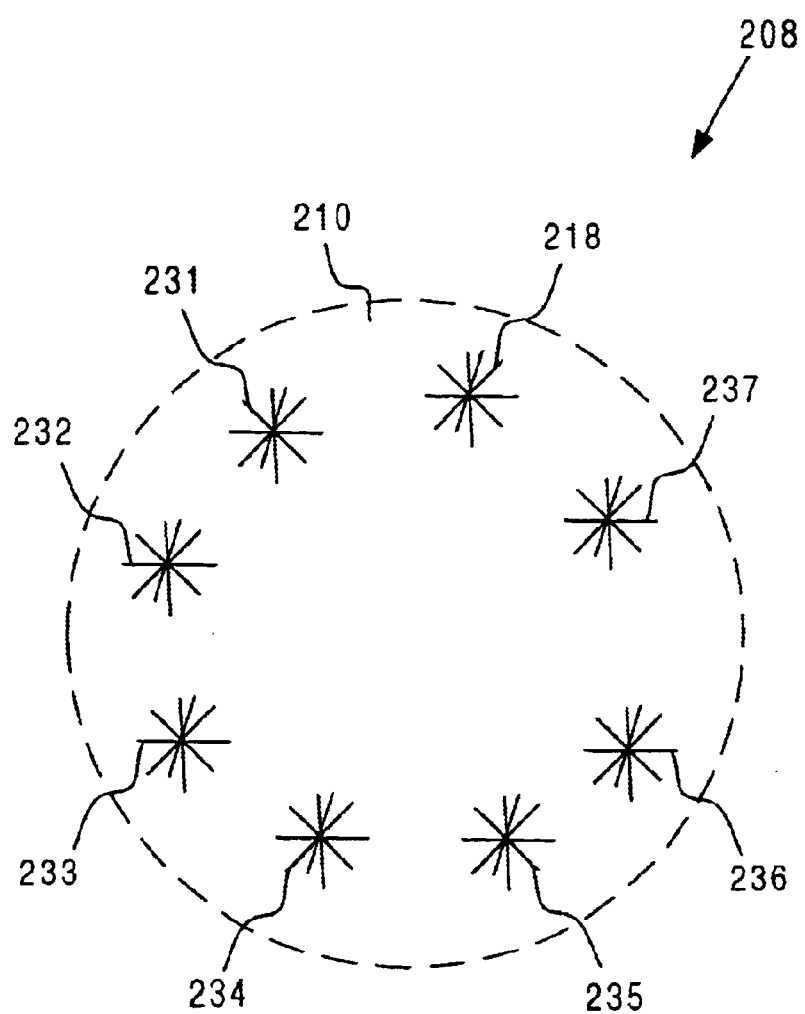
FIG. 2 depicts a top view of a wafer showing the polarization effect achieved by a known photolithography device.

In FIG. 2, a top view of a portion of wafer 208 having photoresist 210 on its surface is generally shown, where wafer 208 and photoresist 210 correspond to wafer 108 and photoresist 110, respectively, in FIG. 1. Points 218, 231, 232, 233, 234, 235, 236 and 237 on photoresist 210 are shown as being exposed to light rays through a photolithography process, such as that described above in conjunction with FIG. 1. As generally depicted in FIG. 2, the effect of polarization at each point 218, 231, 232, 233, 234, 235, 236 and 237 is a combination of the polarization effect of a number of light rays that converges at each corresponding point. Furthermore, the polarization effect of any one individual light ray cannot be distinguished from the polarization effect of the other light rays that converge at the same point. As a consequence, the degree of polarization of light exposed to photoresist 210 at each point 218, 231, 232, 233, 234, 235, 236 and 237 is very difficult to ascertain.

Figure 3:
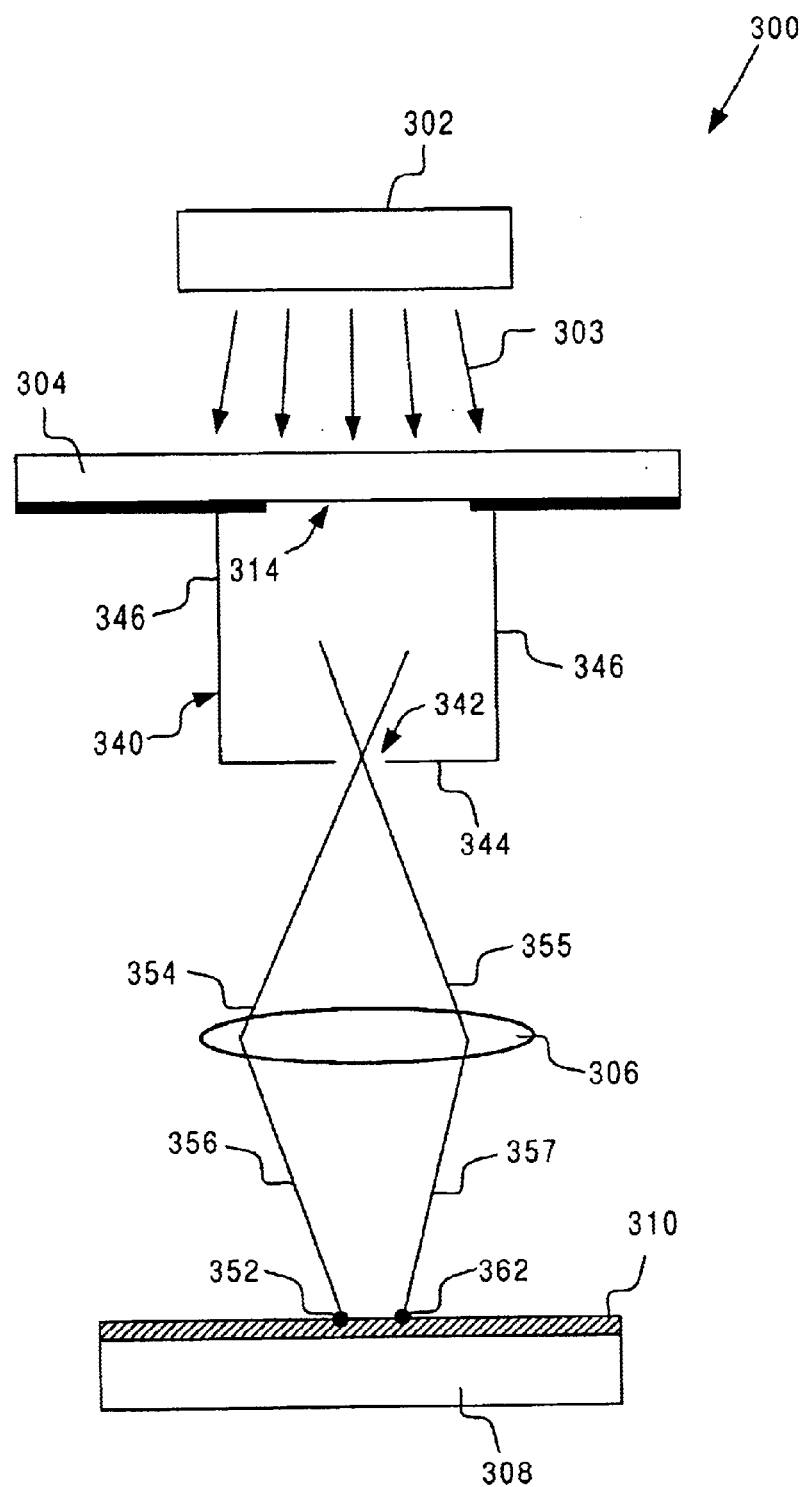
FIG. 3 depicts a block diagram of a polarization measurement device in accordance with one embodiment of the present invention.

Referring now to FIG. 3, a block diagram of polarization measurement device 300 in accordance with one embodiment of the present invention is generally shown. Polarization measurement device 300 comprises frame 340 situated between reticle 304 and lens 306. More particularly, frame 340 is situated below opening 314 of reticle 304, and, as described more fully below, isolates light rays passing through opening 314 of reticle 304.

Light source 302 is situated above reticle 304 and generates light rays 303. For example, light source 302 can be a "G-Line" mercury lamp for providing 436 nanometer (nm) wavelength light in certain embodiments. In other embodiments, other lamps may be used to generate light rays having the desired wavelength.

Wafer 308, having photoresist 310 on its surface, is placed below lens 306, so that photoresist 310 is exposed to light rays 303 passing through opening 314 of reticle 304, aperture 342 of frame 340, and lens 306. Photoresist 310 is sensitive to light rays 303 produced by light source 302 and exhibits characteristic changes upon exposure to light rays 303.

Frame 340 comprises base 344 and sidewalls 346. Base 344 and sidewalls 346 comprise opaque material, such as aluminum, for example. In the particular embodiment shown in FIG. 3, sidewalls 346 extend from base 344 and contact bottom surface of reticle 304. In this particular embodiment, base 344 has a width of approximately 2 millimeters (mm), while sidewalls 346 have a height of approximately 5 mm. Aperture 342 is defined in base 344 and typically has a diameter between 25 to 100 microns. In one particular embodiment, aperture 342 is approximately 50 microns.

Frame 340 is situated below opening 314 in reticle 304 to isolate light rays 303 passing through opening 314. More particularly, frame 340 isolates a single light ray which can be directed at any given point on photoresist 310. Stated differently, frame 340 limits light rays 303 through aperture 342 such that each point on photoresist 310 is exposed to no more than a single ray of light from a single angle of incidence through opening 314 and lens 306. Thus, each point on the photoresist 310 is exposed to only a single ray of light from light source 302 by way of opening 314 of reticle 304, aperture 342 of frame 304, and lens 306. For example, point 352 on photoresist 310, is exposed to only incident ray 354 by way of its refracted component, ray 356. No other light ray. through aperture 342 of frame 340 is directed at point 352. As a consequence, the polarization effect of only ray 356 is present at point 352. Likewise, point 362 on photoresist 310 is exposed only to incident ray 355 by way of its refracted component, ray 357, and no other light ray through aperture 342 of frame 340 is directed at point 362. Therefore, the polarization effect of only ray 357 is present at point 362. The advantages of polarization measurement device 300 will be more readily realized with reference to FIGS. 4 through 6.

Figure 4:
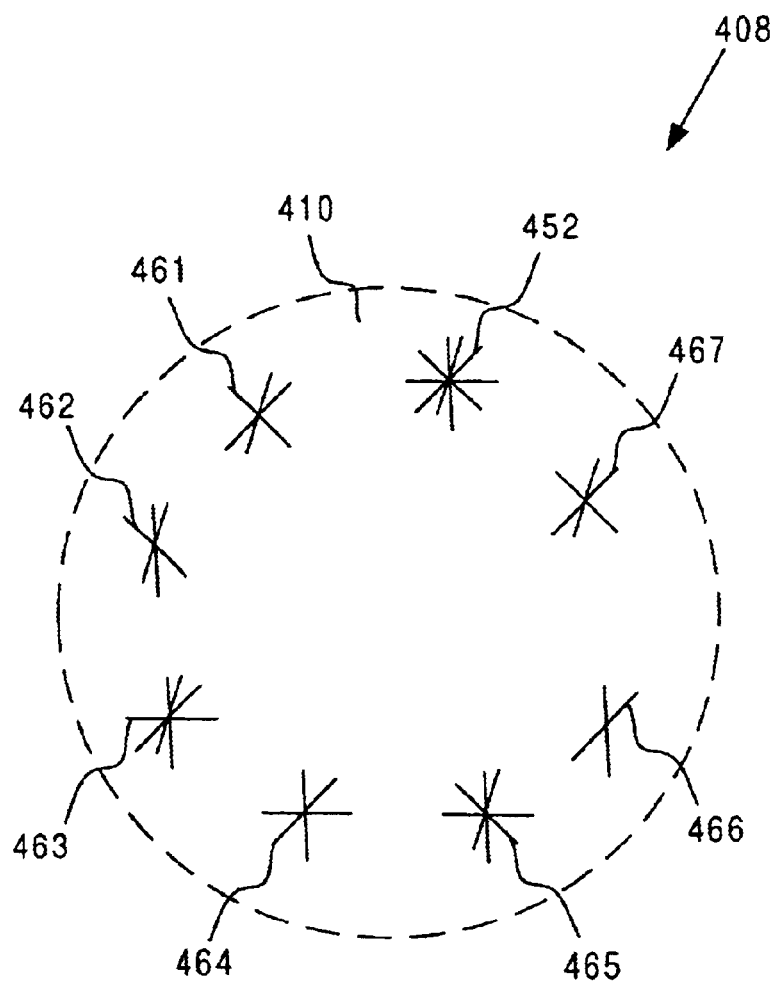
FIG. 4 depicts a top view of a wafer showing the polarization effect achieved by a polarization measurement device in accordance with one embodiment of the present invention.

Referring now to FIG. 4, a top view of a portion of wafer 408 having photoresist 410 on its surface is generally shown, where wafer 408 and photoresist 410 correspond to wafer 308 and photoresist 310, respectively, in FIG. 3. Point 452 and point 462 also correspond respectively to point 352 and point 362 in FIG. 3. On photoresist 410, each point 452, 461, 462, 463, 464, 465, 466 and 467 on photoresist 410 is shown as being exposed to a corresponding single light ray through polarization measurement device 300 of FIG. 3. Since frame 340 limits the exposure at points 452, 461, 462, 463, 464, 465, 466 and 467 to a corresponding single light ray, the polarization effect at each point 452, 461, 462, 463, 464, 465, 466 and 467 is limited to the degree of polarization and the angle of incidence of that corresponding single light ray.

In a case where photoresist 410 is exposed to a light source that is randomly polarized, the polarization effect at each point 452, 461, 462, 463, 464, 465, 466 and 467 is substantially equal. The reason is that in the case where the light source is randomly polarized, the transverse electric component and transverse magnetic component of the ray of light that is directed at each point are substantially equal between all points, and thus the reflectance of the photoresist, which is dependent upon the transverse magnetic component and the transverse electric component of the ray of light, is the same at each point 452, 461, 462, 463, 464, 465, 466 and 467. As a result, the level of absorption of light at each point 452, 461, 462, 463, 464, 465, 466 and 467 is substantially equal.

On the other hand, in the case were photoresist 410 is exposed to a light source that is polarized, the polarization effect at each point 452, 461, 462, 463, 464, 465, 466 and 467 varies according to the degree of polarization of the light source as well as the angle of incidence of the ray of light that is directed at each point 452, 461, 462, 463, 464, 465,466 and 467, respectively. The reason is that in the case where the light source is polarized, at least one of the transverse electric component or transverse magnetic component of the ray of light that is directed at each point is not equal between points 452, 461, 462, 463, 464, 465, 466 and 467. As a result, points 452, 461, 462, 463, 464, 465, 466 and 467 exhibit varying degrees of reflectance, and therefore varying degrees of absorption. Since the effect of polarization at each point 452, 461, 462, 463, 464, 465, 466 and 467 is caused by a single ray of light, i.e., a ray of light from a single angle of incidence, the ability to determine the degree of polarization of the light source can be readily made by inspecting the effect of light exposure on the surface of photoresist 410.

Figure 5:
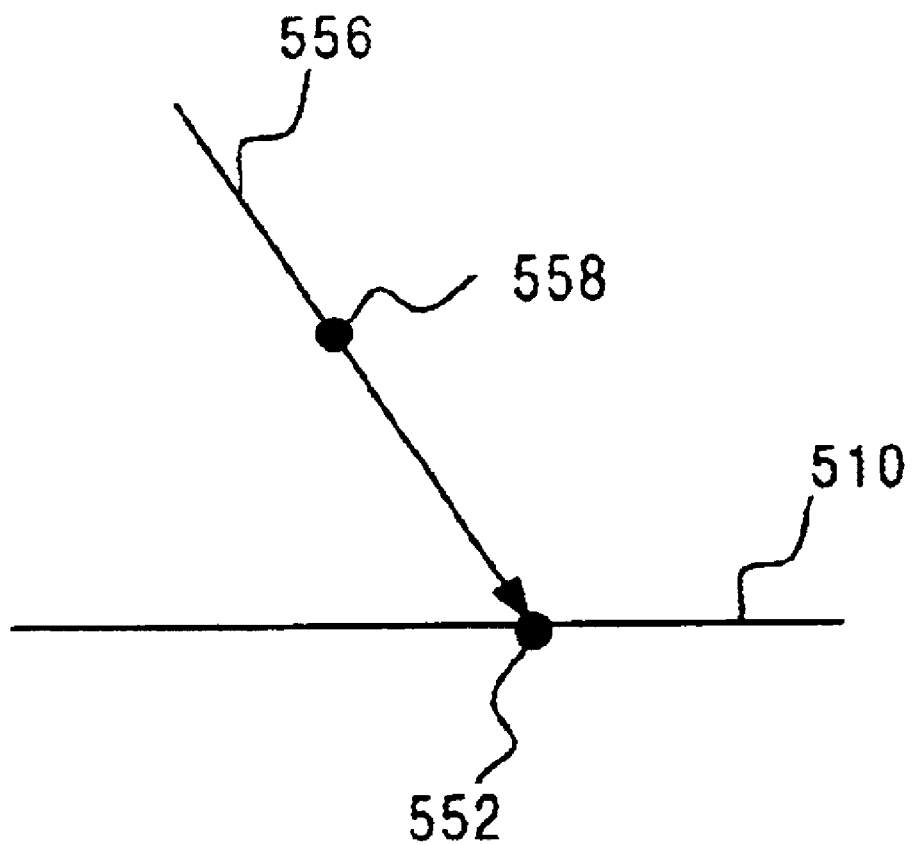
FIG. 5 depicts a side view of a first light ray used to illustrate the operation of one embodiment of a polarization measurement device in accordance with the present invention.

Consider, for example, point 452 with reference to FIG. 5, where point 552 on photoresist 510 corresponds to point 452 on photoresist 410 of FIG. 4. In FIG. 5, a side view of photoresist 510 is shown where point 552 is exposed to only a single incident light ray by way of its refracted component, ray 556. Ray 556 includes a transverse magnetic component (not shown) and a transverse electric component ("TE") 558. In the particular embodiment shown in FIG. 5, TE 558 is parallel to the surface of photoresist 510. With ray 556 having TE 558 parallel to the surface of photoresist 510, photoresist 510 at point 552 exhibits lower reflectance. Lower reflectance at point 552 corresponds to higher absorption of ray 556 at point 552 on photoresist 510. As pointed out above, due to frame 340, no other light ray can affect the level of absorption at point 552, and therefore at point 552, only the polarization effect of ray 556 is present.

Figure 6:
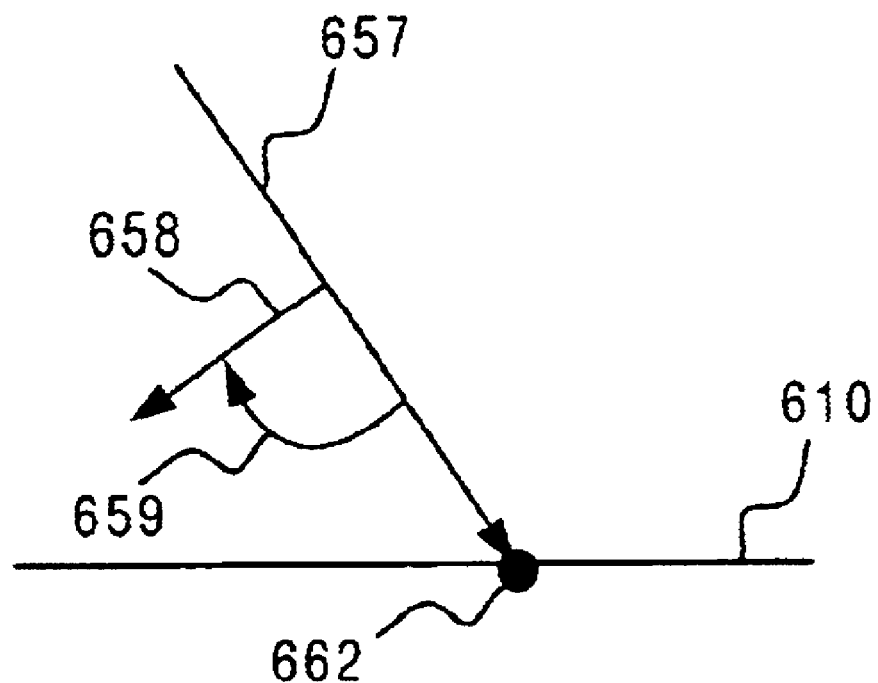
FIG. 6 depicts a side view of a second light ray used to illustrate the operation of one embodiment of a polarization measurement device in accordance with the present invention.

By way of contrast, consider point 462 on photoresist 410 with reference to FIG. 6, where point 662 on photoresist 610 corresponds to point 462 on photoresist 410 of FIG. 4. In FIG. 6, a side view of photoresist 610 is shown where point 662 is exposed to only a single incident light ray by way of its refracted component, ray 657. In the particular embodiment shown in FIG. 6, TE 658 of ray 657 is at angle 659 incident to the surface of photoresist 610. With ray 657 having TE 658 at angle 659 to the surface of photoresist 610, photoresist 610 at point 662 exhibits higher reflectance, e.g., in contrast to the case where TE is parallel to the surface of photoresist 610 (as described above in conjunction with FIG. 5). Higher reflectance at point 662 corresponds to lower absorption of ray 657 at point 662 on photoresist 610. Due to frame 340, no other light ray can affect the level of absorption at point 662, and therefore at point 662, only the polarization effect of ray 657 is present. Likewise, only the polarization effect of a corresponding single light ray is present at each of points 461, 463, 464, 465, 466 and 467 on photoresist 410 in FIG. 4.

Thus points 452, 461, 462, 463, 464, 465, 466 and 467 on photoresist 410 reveal the degree of polarization of the light source by exhibiting variation in the levels of light absorption between points where the light source is polarized and by exhibiting equal levels of light absorption between points where the light source is randomly polarized. A larger variation in light absorption levels between points corresponds to a greater degree of polarization of the light source. Thus, the degree of polarization of a light source used in photolithography can be readily determined through polarization measurement device 300 based on the extent of variations in absorption of light by photoresist 410.

Figure 7:
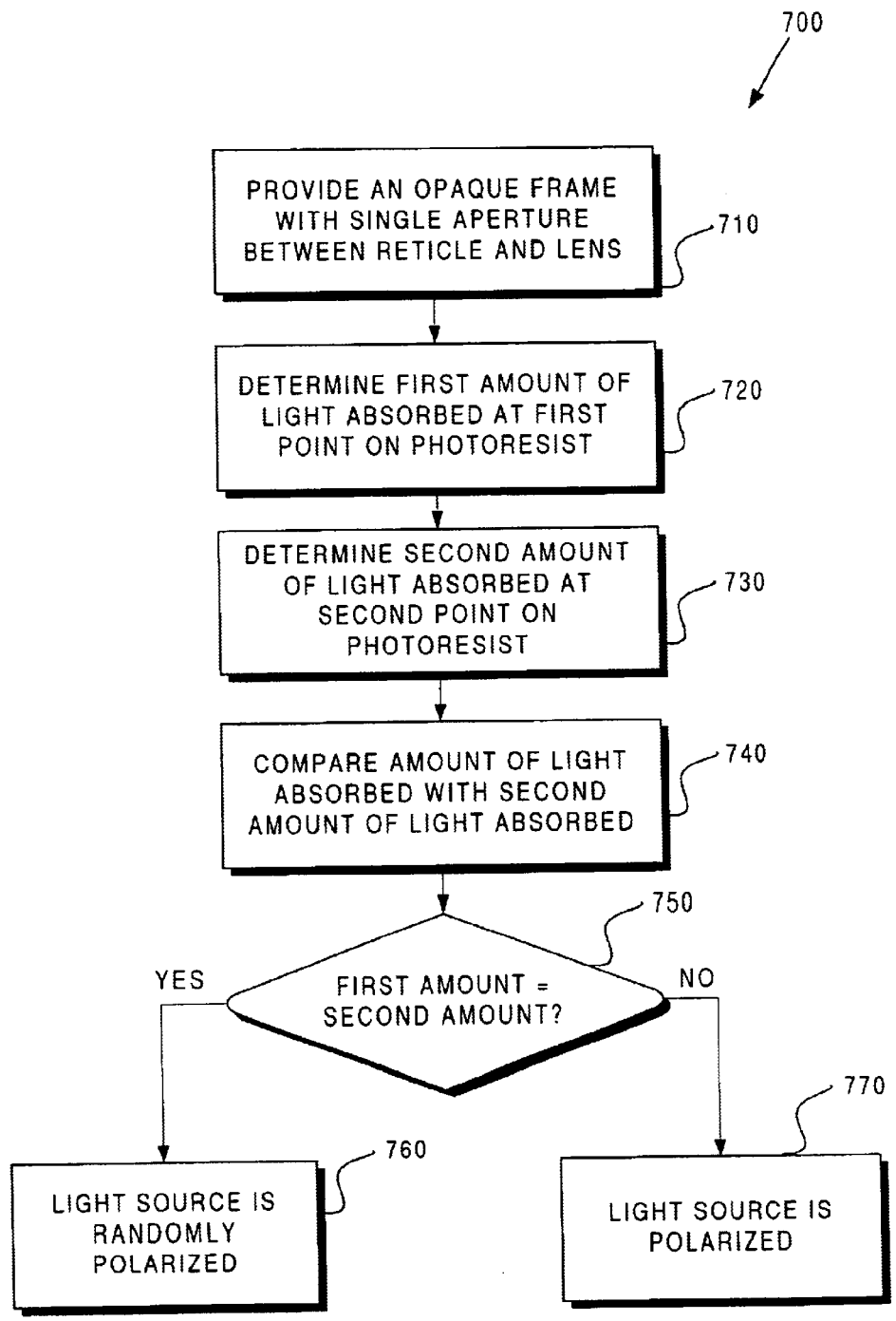
FIG. 7 depicts a flow diagram depicting a method for measuring the polarization effect in accordance with one embodiment of the present invention.

Referring to FIG. 7, flow diagram 700 depicts a method for measuring the polarization effect in accordance with one embodiment of the present invention. First at block 710, an opaque frame having a single aperture is provided between a reticle and a lens, e.g., in a photolithography device. For example, in FIG. 3, frame 340 having aperture 342 is provided between reticle 304 and lens 306 to isolate light rays 303 passing through hole 314 of reticle 304 such that each point on a photoresist 310 (photoresist 310 being positioned below lens 306) is exposed to no more than a corresponding single ray of light having a corresponding single angle of incidence. For example, in FIG. 3, point 352 of photoresist 310 is exposed to only ray 356.

Next at block 720, after exposing the photoresist to a light source through the aperture in the frame, a first amount of light absorbed at a first point on the photoresist is determined. For example, in FIG. 3, the amount of light absorbed at point 352 is determined using means for detecting the absorption of light known in the art. Also at block 730, a second amount of light absorbed at a second point on the photoresist is determined. For example, in FIG. 3, the amount of light absorbed at point 362 is determined.

At block 740, the first amount of light absorbed at the first point on the photoresist is compared to the second amount of light absorbed at the second point on the photoresist. For example, in FIG. 3, the amount of light absorbed at point 352 is compared to the amount of light absorbed at point 362. At decision block 750, if the first amount of light absorbed is the same as the second amount of light absorbed, block 760 is carried out, wherein the light source is determined to be randomly polarized. If, on the other hand, the first amount of light absorbed is not the same as the second amount of light absorbed, block 770 is carried out, wherein the light source is determined to be polarized based on the extent of the variation in absorption levels between the first point and the second point.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the specific orientation of the frame can be modified without departing from the scope of the present invention, as noted above. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a device and method for measuring the degree of polarization of light during photolithography has been described.

What is claimed is:

1. A method for measuring the polarization effect on a photoresist during photolithography, said method comprising the steps of:

providing an opaque frame between a reticle and a lens, said opaque frame having a single aperture which allows no more than a first light ray to pass from a light source through said reticle and said lens onto a first surface point on said photoresist, said aperture allowing no more than a second light ray to pass from said light source through said reticle and said lens onto a second surface point on said photoresist, said second surface point different from said first surface point; and comparing a first amount of light received on said first surface point with a second amount of light received on said second surface point.

2. The method of claim 1, wherein each of said first light ray and said second light ray has a corresponding single angle of incidence.

3. The method of claim 1, wherein said opaque frame comprises a base, said aperture defined in said base, said opaque frame further comprising sidewalls extending from said base, said sidewalls contacting a bottom surface of said reticle.

4. The method of claim 1, wherein said opaque frame comprises aluminum.

5. The method of claim 1, wherein said photoresist at said first point is exposed only to said first light ray and wherein said photoresist at said second point is exposed only to said second light ray.

6. The method of claim 1, wherein said light source is determined to be randomly polarized if said first amount of light is the same as said second amount of light.

7. The method of claim 1, wherein said light source is determined to be polarized if said first amount of light is different from said second amount of light.

8. A method for measuring the polarization effect on a photoresist during photolithography, said method comprising the steps of:

providing an opaque frame between a reticle and a lens, said opaque frame having a single aperture which allows no more than a single light ray to pass from a light source through said reticle and said lens onto a surface point on said photoresist; and determining a amount of light absorbed on said surface point on said photoresist, wherein said degree of polarization of said light source is determined from said amount of light absorbed on said surface point.

9. The method of claim 8, wherein said single light ray has a single angle of incidence.

10. The method of claim 8, wherein said photoresist at said surface point is exposed only to said single light ray.

11. The method of claim 8, wherein said opaque frame comprises a base, said aperture defined in said base, said opaque frame further comprising sidewalls extending from said base, said sidewalls contacting a bottom surface of said reticle.

12. A polarization measuring device for measuring the polarization effect on a photoresist during photolithography, said polarization measuring device comprising:

a light source;

a reticle positioned below said light source;

an opaque frame having a single aperture, said opaque frame positioned below said reticle;

a lens positioned below said opaque frame; and a wafer having said photoresist on a surface of said wafer, said wafer positioned below said lens, said aperture allowing no more than a first light ray to pass from said light source through said reticle and said lens onto a first surface point on said photoresist; wherein said aperture further allows no more than a second light ray to pass from said light source through said reticle and said lens onto a second surface point on said photoresist, said second surface point different from said first surface point, and wherein said photoresist at said first point absorbs a first amount of light, and said photoresist at said second point absorbs a second amount of light, wherein said light source is determined to be randomly polarized if said first amount of light is the same as said second amount of light.

13. The polarization measuring device of claim 12, wherein said light source is determined to be polarized if said first amount of light is different from said second amount of light.

\* \* \* \* \*